(12) United States Patent
Chang et al.

(10) Patent No.: US 7,932,601 B2
(45) Date of Patent: Apr. 26, 2011

(54) ENHANCED COPPER POSTS FOR WAFER LEVEL CHIP SCALE PACKAGING

(75) Inventors: Kuo-Chin Chang, Hsin-Chu (TW); Han-Ping Pu, Taichung (TW); Pei-Haw Tsao, Tai-Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/899,168

(22) Filed: Oct. 6, 2010

(65) Prior Publication Data

US 2011/0057313 A1 Mar. 10, 2011

Related U.S. Application Data

(63) Continuation of application No. 11/807,522, filed on May 29, 2007, now Pat. No. 7,820,543.

(51) Int. Cl.
*H01L 23/48* (2006.01)
*H01L 21/44* (2006.01)

(52) U.S. Cl. .......................................... 257/738; 438/613

(58) Field of Classification Search .......... 438/613–614; 257/738, 780, E23.021
See application file for complete search history.

(56) References Cited

U.S. PATENT DOCUMENTS

| | | | |
|---|---|---|---|
| 5,466,635 A | 11/1995 | Lynch et al. | |
| 5,736,456 A | 4/1998 | Akram | |
| 5,759,910 A | 6/1998 | Mangold et al. | |
| 6,107,164 A | 8/2000 | Ohuchi | |
| 6,107,180 A | 8/2000 | Munroe et al. | |
| 6,229,220 B1 | 5/2001 | Saitoh et al. | |
| 6,232,243 B1 | 5/2001 | Farnworth et al. | |
| 6,323,546 B2 | 11/2001 | Hsuan et al. | |
| 6,454,159 B1 | 9/2002 | Takushima | |
| 6,600,234 B2 | 7/2003 | Kuwabara et al. | |
| 6,717,245 B1 | 4/2004 | Kinsman et al. | |
| 6,906,418 B2 | 6/2005 | Hiatt et al. | |
| 7,129,575 B1 | 10/2006 | Lin et al. | |
| 7,271,084 B2 | 9/2007 | Jeong et al. | |
| 7,285,867 B2 * | 10/2007 | Matsuzaki et al. | 257/787 |
| 7,382,049 B2 | 6/2008 | Ho et al. | |
| 7,820,543 B2 * | 10/2010 | Chang et al. | 438/613 |
| 2002/0132461 A1 | 9/2002 | Kizaki | |
| 2003/0107137 A1 | 6/2003 | Stierman et al. | |
| 2005/0026416 A1 | 2/2005 | Cheng et al. | |
| 2005/0084989 A1 | 4/2005 | Wakabayashi et al. | |
| 2006/0055032 A1 | 3/2006 | Chang et al. | |
| 2006/0180887 A1 | 8/2006 | Ono | |
| 2006/0211233 A1 | 9/2006 | Gan et al. | |

(Continued)

FOREIGN PATENT DOCUMENTS

CN 1375869 A 10/2002

(Continued)

*Primary Examiner* — Calvin Lee
(74) *Attorney, Agent, or Firm* — Slater & Matsil, L.L.P.

(57) ABSTRACT

An enhanced wafer level chip scale packaging (WLCSP) copper electrode post is described having one or more pins that protrude from the top of the electrode post. When the solder ball is soldered onto the post, the pins are encapsulated within the solder material. The pins not only add shear strength to the soldered joint between the solder ball and the electrode post but also create a more reliable electrical connection due to the increased surface area between the electrode post/pin combination and the solder ball. Moreover, creating an irregularly shaped solder joint retards the propagation of cracks that may form in the intermetal compounds (IMC) layer formed at the solder joint.

20 Claims, 6 Drawing Sheets

U.S. PATENT DOCUMENTS

| | | |
|---|---|---|
| 2007/0029654 A1 | 2/2007 | Sunohara et al. |
| 2008/0296764 A1 | 12/2008 | Chang et al. |
| 2009/0096092 A1 | 4/2009 | Patel |
| 2009/0130840 A1 | 5/2009 | Wang et al. |

FOREIGN PATENT DOCUMENTS

| | | |
|---|---|---|
| CN | 1499595 A | 5/2004 |
| CN | 1750257 A | 3/2006 |
| JP | 2006-287048 | 10/2006 |

\* cited by examiner

ENHANCED COPPER POSTS FOR WAFER LEVEL CHIP SCALE PACKAGING

This application is a continuation of U.S. patent application Ser. No. 11/807,522, entitled "Enhanced Copper Posts for Wafer Level Chip Scale Packaging," filed on May 29, 2007 now U.S. Pat. No. 7,820,543, which application is incorporated herein by reference.

TECHNICAL FIELD

The present invention relates generally to wafer level chip scale packaging (WLCSP), and more particularly to an enhanced copper post used in WLCSP.

BACKGROUND

The past few decades have seen many shifts in electronics and semiconductor packaging that have impacted the entire semiconductor industry. The introduction of surface-mount technology (SMT) and ball grid array (BGA) packages were generally important steps for high-throughput assembly of a wide variety of integrated circuit (IC) devices, while, at the same time, allowing reduction of the pad pitch on the printed circuit board. Conventionally packaged ICs have a structure basically interconnected by fine gold wire between metal pads on the die and electrodes spreading out of molded resin packages. Dual Inline Package (DIP) or Quad Flat Package (QFP) are fundamental structures of current IC packaging. However, increased pin count peripherally designed and arranged around the package typically results in too short of a pitch of lead wire, yielding limitations in board mounting of the packaged chip.

Chip-scale or chip-size packaging (CSP) and BGA packages are just some of the solutions that enable dense electrode arrangement without greatly increasing the package size. CSP provides for wafer packaging on a chip-size scale. CSP typically results in packages within 1.2 times the die size, which greatly reduces the potential size of devices made with the CSP material. Although these advances have allowed for miniaturization in electronic devices, the ever-demanding trend toward even smaller, lighter, and thinner consumer products have prompted even further attempts at package miniaturization.

To fulfill market demands toward increased miniaturization and functionality, WLCSP has been introduced in recent years for generally increasing density, performance, and cost-effectiveness, while decreasing the weight and size of the devices in the electronic packaging industry. In WLCSP, the packaging is typically generated directly on the die with contacts provided by BGA packages and bump electrodes. Recent advanced electronic devices, such as mobile phones, mobile computers, camcorders, personal digital assistants (PDAs), and the like, utilize compact, light, thin, and very densely packaged ICs. Using WLCSP for packaging smaller die size devices with lower numbers of pins, corresponding to larger numbers of chips on one wafer, is, therefore, usually advantageous and cost-effective.

One disadvantage of current WLCSP technology is the formation of cracks between the solder ball and the electrode post. The solder ball or bump is typically placed onto the bump electrode or post directly, relying on the soldered joint for structural integrity. The different layers making up the WLCSP device typically have different coefficients of thermal expansion (CTEs). As a result, a relatively large stress derived from this difference is exhibited on the joint between the post and the bump electrode, which often causes cracks to form in the bonding area between the bump electrode/post and the solder ball or bump.

FIG. 1 is a cross-section of a typical, single solder ball of WLCSP feature 10. WLCSP feature 10 is formed directly on die 100. Copper pad 102 is formed on die 100. Copper pad 102 acts as a contact and bonding pad for solder ball 101. During the soldering process, intermetallic compounds (IMC) are naturally formed in a layer, i.e., IMC formation layer 103, at the joint between solder ball 101 and copper pad 102. While existence of IMC formation layer 103 generally signifies a good weld between the solder and the substrate, it is usually the most brittle part of the weld. Because the weld joint is so small in WLCSP, cracks, such as crack 104, may form more easily under the stresses experienced at the joint, and such cracks, because of the size of the overall package, may be more damaging. A small crack that starts along one side of solder ball 101, such as crack 104, may easily propagate across the length of the straight solder joint.

One method that has been suggested to diminish this stress cracking is described in U.S. Pat. No. 6,600,234, to Kuwabara, et al., entitled, "MOUNTING STRUCTURE HAVING COLUMNAR ELECTRODES AND A SEALING FILM." This method describes forming a sealing film using multiple layers where a portion of the bump electrode protrudes from the sealing film. The protruding electrode assists in absorbing part of the stress caused by the difference in the CTE. The multiple layers of the sealing film are also selected to have graduated CTEs, such that the CTE of the film near the substrate is close to the CTE of the substrate, while the CTE of the film near the circuit substrate is close to the CTE of the circuit substrate. This graduated CTE helps alleviate the stresses that would be caused by sharply different CTEs. However, the multiple layers of the sealing film still usually exhibit a weak shear strength and do not reduce the propagation of any cracks that may form in the IMC layer, thus, reducing the overall reliability of the joint.

SUMMARY OF THE INVENTION

These and other problems are generally solved or circumvented, and technical advantages are generally achieved, by preferred embodiments of the present invention which form one or more pins that protrude from the top of the WLCSP electrode post. Thus, when the solder ball is soldered onto the post, the pins are encapsulated within the solder material. The pins not only add shear strength to the soldered joint between the solder ball and the electrode post but also create a more reliable electrical connection due to the increased surface area between the electrode post/pin combination and the solder ball. Moreover, creating an irregularly shaped solder joint retards the propagation of cracks that may form in the intermetallic compounds (IMC) layer formed at the solder joint.

In accordance with a preferred embodiment of the present invention, a method for manufacturing a semiconductor device includes forming at least one conductive post on a semiconductor wafer, where the conductive post is electrically connected to a wiring layer of the semiconductor wafer. One or more conductive pins are formed on a surface of the conductive posts, where the conductive pins protrude from the surface of the conductive post. A solder ball is welded onto the surface of each of the conductive posts, where the solder ball encapsulates the conductive pins protruding from the surface of the conductive posts.

In accordance with another preferred embodiment of the present invention, a semiconductor device includes a substrate, a circuit layer within the substrate, and a wiring layer on a top surface of the substrate. The wiring layer electrically connects the circuit layer to the electrodes protruding from the top surface of the substrate. The electrodes are electrically connected to the wiring layer and have one or more pins protruding from the top of the electrodes. A solder ball is in contact with the top of the electrode and encapsulates the pins.

In accordance with another preferred embodiment of the present invention, a method for manufacturing a semiconductor device includes creating a wiring layer in a semiconductor die. A layer of polymer insulator is deposited on a first surface of the semiconductor die. One or more electrodes are formed through the layer of polymer insulator, where the electrodes are electrically connected to the wiring layer. At least one pin is formed protruding from the top surface of the electrodes. A solder ball is soldered onto the top surface of each of the electrodes, where the solder ball encapsulates all of the pins protruding from the tops of each of the electrodes.

In accordance with another preferred embodiment of the present invention, a semiconductor device includes a substrate, one or more wiring layers within a first surface of the substrate, and a polymer insulation layer over the first surface. The polymer insulation layer has one or more conducting posts running through it between the first surface of the substrate and a top of the polymer insulation layer. The posts are electrically connected to corresponding wiring layers. A solder ball is in physical contact with a top surface of each of the conducting posts and encapsulates each of the conducting pins protruding from the top surface of the corresponding post.

In accordance with another preferred embodiment of the present invention, a semiconductor device comprises a substrate and a wiring layer over the substrate. An insulation layer is over the wiring layer and a first conductive post is electrically connected to the wiring layer and extends through the insulation layer, the first conductive post comprising a single material. At least one pin is in contact with the first conductive post and a solder ball surrounds the at least one pin and is in physical contact with the first conductive post.

An advantage of a preferred embodiment of the present invention is that by forming the conducting pins that are eventually encapsulated within the solder balls, the shear strength of the entire WLCSP assembly is increased.

A further advantage of a preferred embodiment of the present invention is improved conductivity. The additional pin or pins create additional surface areas between the electrode and the solder ball. Therefore, the electrical connection between the solder ball and the electrode is more reliable.

A further advantage of a preferred embodiment of the present invention is improved resistance to crack propagation through the IMC layer that is naturally formed at the soldered joint between the electrodes and the solder balls. By creating a varied profile that is not simply a straight line, cracks that form on one side of the joint within the IMC layer do not propagate as easily as they would across a straight line joint.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a copper post WLCSP. The invention may also be applied, however, to other materials used in providing the conductive connections between the packaging and the wafer or die.

Figure 1:
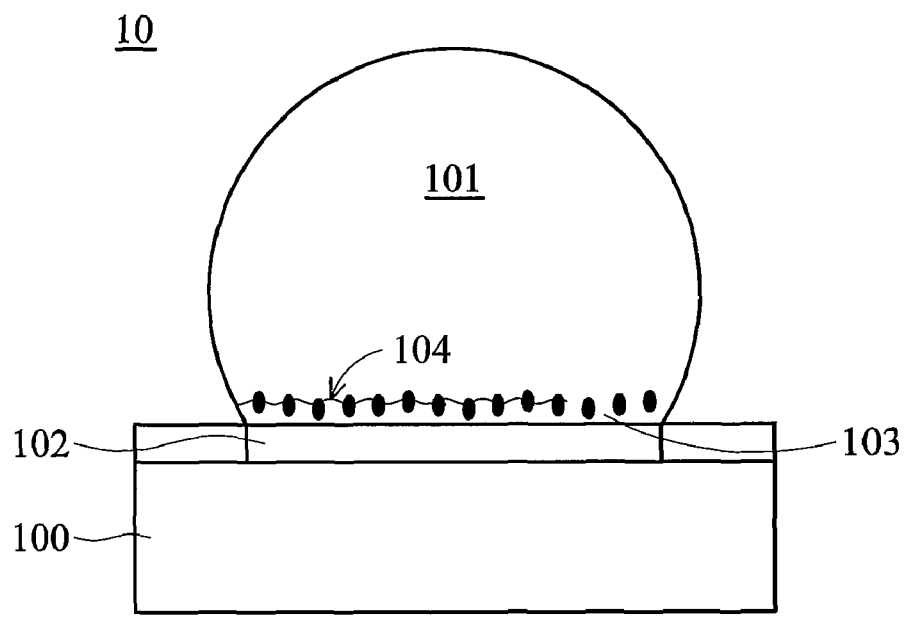
FIG. 1 is a cross-section of a typical, single solder ball having a WLCSP feature.
Figure 2:
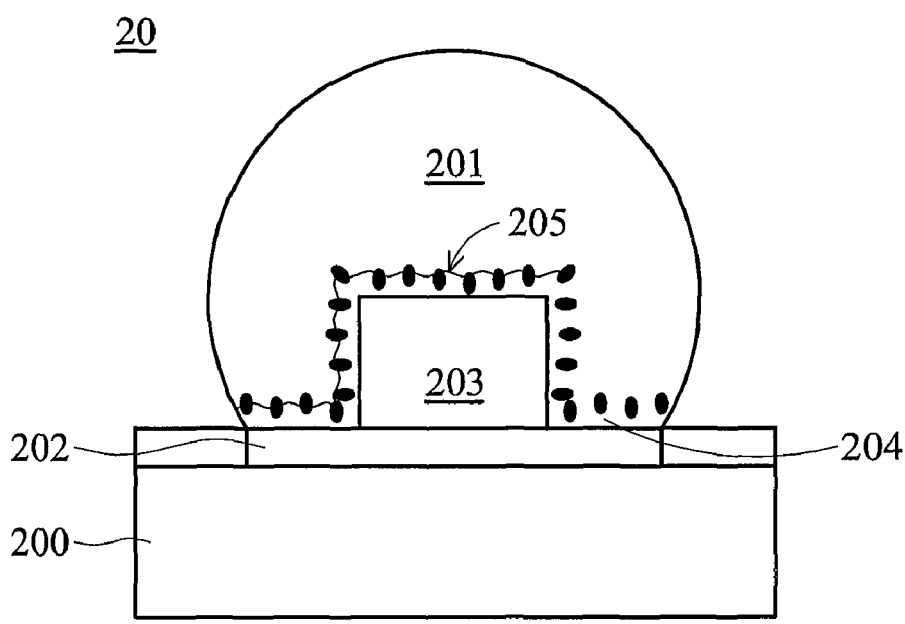
FIG. 2 is a cross-sectional view of a WLCSP feature configured according to one embodiment of the present invention.

With reference now to FIG. 2, there is shown a cross-sectional view of WLCSP feature 20 configured according to one embodiment of the present invention. Conducting pad 202 is formed into die 200 as a base for the contact and bonding mechanism for solder ball 201. In addition to conducting pad 202, conducting stud 203 is formed on conducting pad 202, which creates a variance in the surface profile of die 200. As solder ball 201 is soldered onto die 200, an irregularly-shaped joint is created that follows the profile of conducting pad 202 and conducting stud 203. IMC formation layer 204, which forms naturally in the joint, is, therefore, broken up across the joint. Thus, a crack, such as crack 205, that starts at one end of IMC formation layer 204 will preferably not propagate as readily as in the straight joint of the existing bonding methods. This irregular shape results in a stronger and more reliable bond at the joint of solder ball 201 and die 200. It preferably retards the propagation of cracks and increases the shear strength of the solder joint. The irregular shape also increases the surface area of contact between die 200 and solder ball 201, which also improves the conductivity of the joint.

Figure 3A:
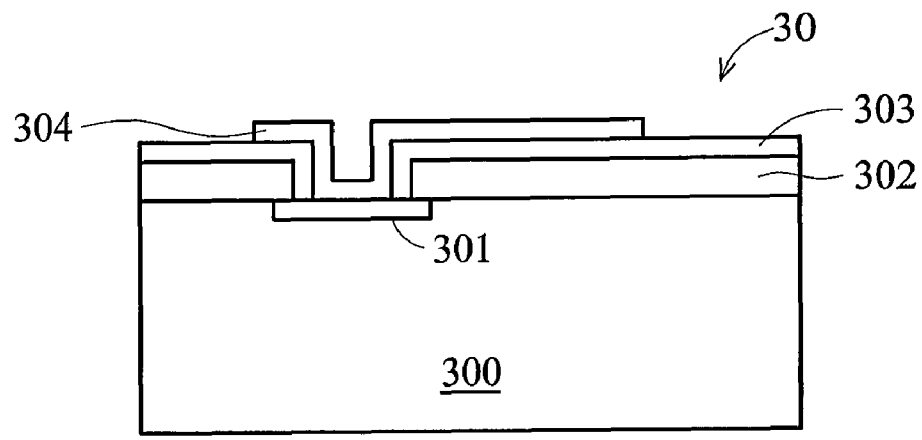
FIG. 3A is a cross-sectional view of a silicon wafer at an initial stage of forming a WLCSP feature according to one embodiment of the present invention.

FIG. 3A is a cross-sectional view of silicon wafer 300 at an initial stage of forming WLCSP feature 30 according to one embodiment of the present invention. Silicon wafer 300 has been processed to form wiring contact 301, passivation layer 302, and insulation layer 303. Re-distributed layer (RDL) 304 provides a conductive path from wiring contact 301 onto the surface of silicon wafer 300.

It should be noted that insulation layer 303 may comprise various insulating materials, such as polymide, or other such polymer insulator. The description provided in FIG. 3 is not intended to limit the present invention to any particular material for providing such an insulation layer. In fact, in additional and/or alternative embodiments, construction of an inventive WLCSP feature may not include an insulation layer, such as insulation layer 303.

Figure 3B:
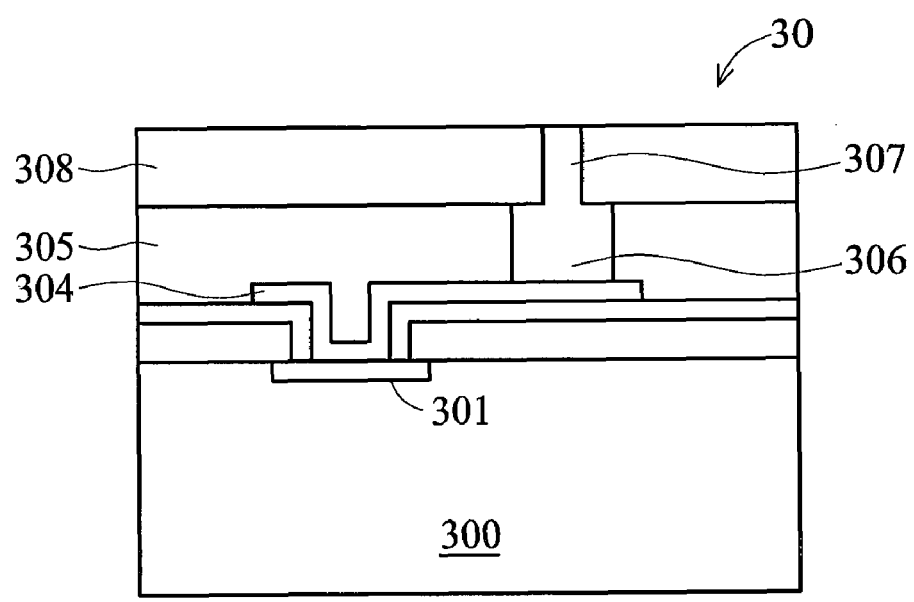
FIG. 3B is a cross-sectional view of a silicon wafer after formation of a bump post and a pin according to one embodiment of the present invention.

FIG. 3B is a cross-sectional view of silicon wafer 300 after formation of bump post 306 and pin 307 according to one embodiment of the present invention. In the process of forming WLCSP feature 30 to the state in FIG. 3B, bump post 306 has been formed in polymer insulation layer 305, while pin 307 has been formed through photoresist layer 308. The combination of pin 307, bump post 306, and RDL 304 provides a conductor to wiring contact 301.

It should be noted that polymer insulation layer 305 may comprise various polymer insulating materials, such as epoxy, polymide, and the like. The polymer material may be selected for a particular CTE in order to reduce the effective stress exerted on the wafer.

It should further be noted that the formation of pin 307 and other pins or studs of the various embodiments of the present invention may be implemented through any number of semiconductor fabrication techniques, including material deposition techniques, such as physical vapor deposition (PVD), chemical vapor deposition (CVP), electrochemical deposition (ECD), molecular beam epitaxy (MBE), atomic layer deposition (ALD), electroplating, and the like; removal or etching processes, both wet and dry etching, such as reactive ion etch (RIE), or the like; and patterning or lithography, using both positive or negative photoresist techniques.

Figure 3C:
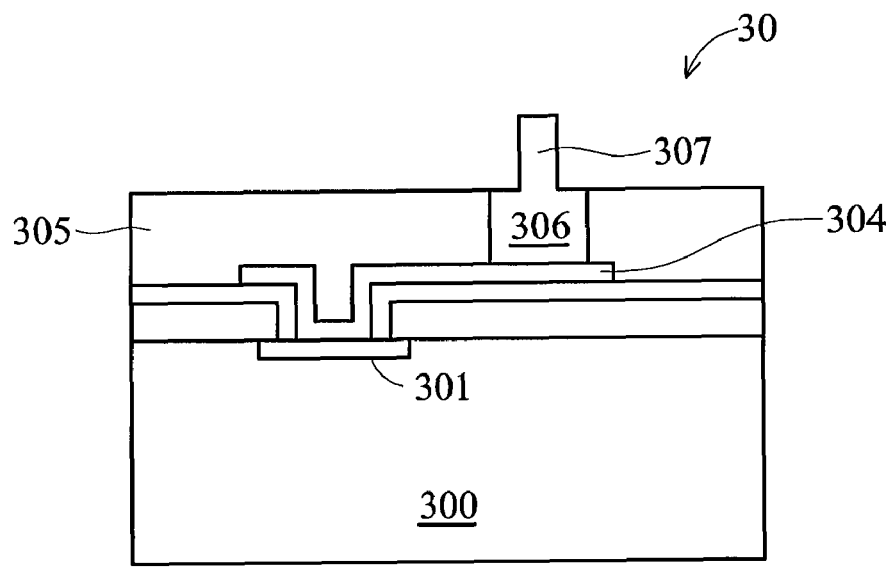
FIG. 3C is a cross-sectional view of a silicon wafer having a WLCSP feature configured according to one embodiment of the present invention.

FIG. 3C is a cross-sectional view of silicon wafer 300 of WLCSP feature 30 configured according to one embodiment of the present invention. After photoresist layer 308 has been removed from WLCSP feature 30, pin 307 protrudes from the top surface of wafer 300. Polymer insulation layer 305 remains to seal and protect wafer 300 once it has been connected into its final device.

Figure 3D:
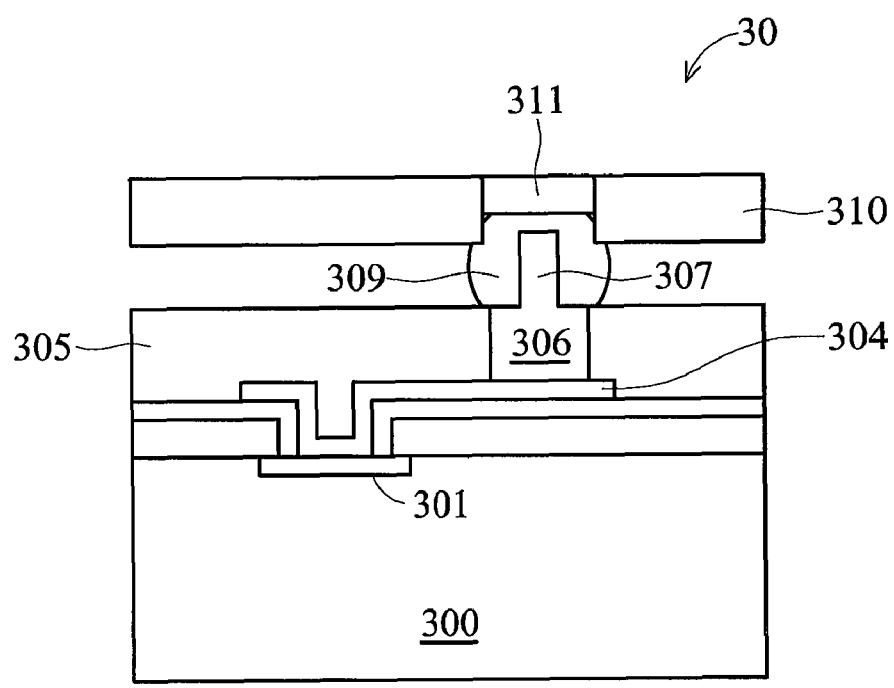
FIG. 3D is a cross-sectional view of a WLCSP feature configured according to one embodiment of the present invention.

FIG. 3D is a cross-sectional view of WLCSP feature 30 configured according to one embodiment of the present invention. WLCSP feature 30 connects wafer 300 to circuit board 310 through solder ball 309. Solder ball 309 is welded onto wafer 300 at bump post 306. It is formed around and encapsulates pin 307 and provides an electrical connection between circuit board 310 and wiring contact 301 of wafer 300. Solder ball 309 makes an electrical contact with bump post 306, pin 307, and contact plate 311. By forming solder ball 309 around pin 307, the shear strength of the joint holding solder ball 309 to wafer 300 is increased. Moreover, the greater surface contact area between solder ball 309, bump post 306, and pin 307 provides improved electrical contact with wafer 300.

It should be noted that the WLCSP feature of the embodiment described in FIGS. 3A-3D is purely one example of an inventive WLCSP feature configured according to the invention. The specific features and materials that are described in FIGS. 3A-3D are not intended to limit additional or alternative applications of the present invention.

Figure 4:
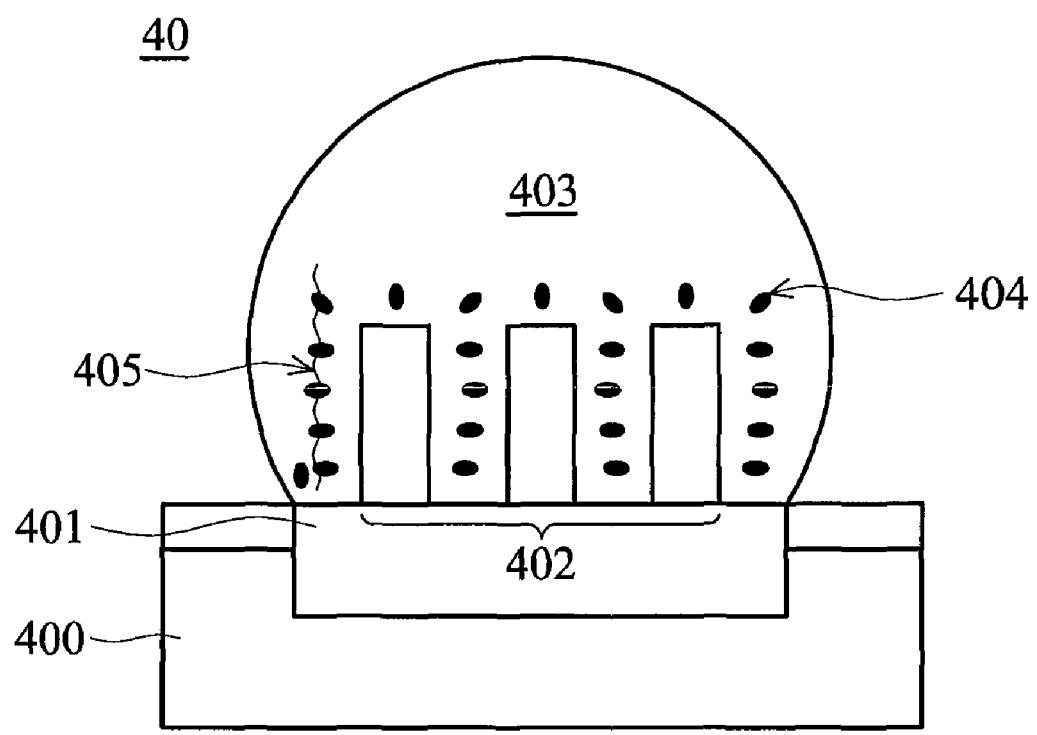
FIG. 4 is a diagram illustrating a WLCSP feature configured according to one embodiment of the present invention.

FIG. 4 is a diagram illustrating WLCSP feature 40 configured according to one embodiment of the present invention. Electrode 401 is formed into die 400 as a base for the contact and bonding mechanism for solder ball 403. In addition to electrode 401, conducting studs 402 are formed on electrode 401, which creates a variance in the surface profile of die 400. As solder ball 403 is soldered onto die 400, an irregularly-shaped joint is created that follows the profile of electrode 401 and conducting studs 402. IMC formation layer 404, which forms naturally in the joint, is, therefore, broken up across the joint. Thus, a crack, such as crack 405, that starts at one end of IMC formation layer 404 will preferably not propagate as readily as in the straight joint of the existing bonding methods. This irregular shape results in a stronger and more reliable bond at the joint of solder ball 403 and die 400. It preferably retards the propagation of cracks and increases the shear strength of the solder joint. The irregular shape also increases the surface area of contact between die 400 and solder ball 403, which also improves the conductivity of the joint.

It should be noted that FIGS. 2 and 4 represent examples of the numbers of pins that may be formed onto the posts or electrodes of the various embodiments of the present invention. Any number of pins may be formed on the surface of the electrodes limited only by the technological limits of forming the pins thereon. The various embodiments of the present invention are not limited to any one number of pins.

Figure 5:
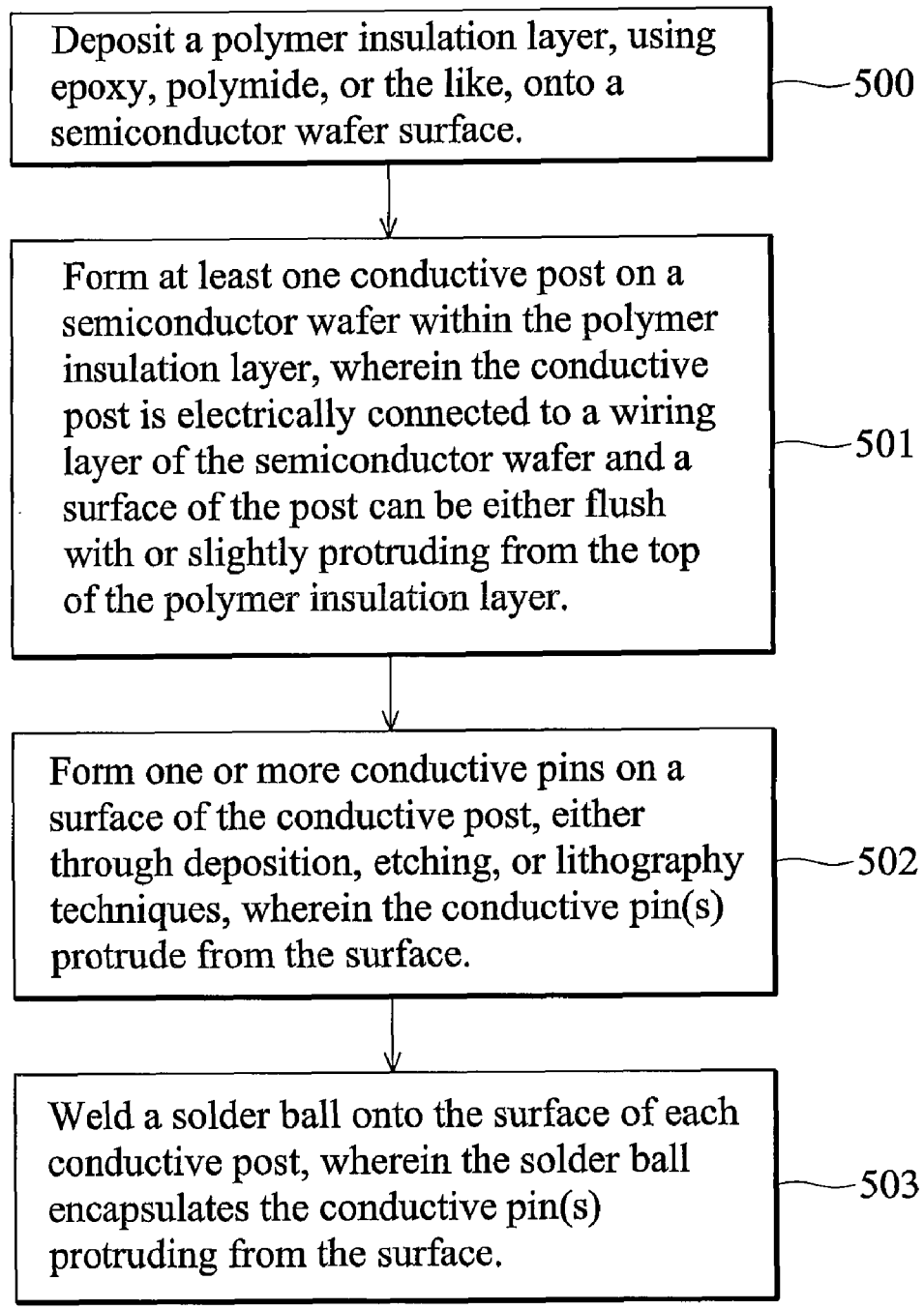
FIG. 5 is a flowchart illustrating example steps executed when implementing one embodiment of the present invention.

FIG. 5 is a flowchart illustrating example steps executed when implementing one embodiment of the present invention. In step 500, a polymer insulation layer is deposited, using epoxy, polymide, or the like, onto a semiconductor wafer surface. At least one conductive post is formed, in step 501, on a semiconductor wafer within the polymer insulation layer, wherein the conductive post is electrically connected to a wiring layer of the semiconductor wafer, and a surface of the post can be either flush with or slightly protruding from the top of the polymer insulation layer. One or more conductive pins are formed, in step 502, on a surface of the conductive post, either through deposition, etching, or lithography techniques, wherein the conductive pin(s) protrude from the surface. A solder ball is welded onto the surface of each conductive post, in step 503, where the solder ball encapsulates the conductive pin(s) protruding from the surface.

Figure 6:
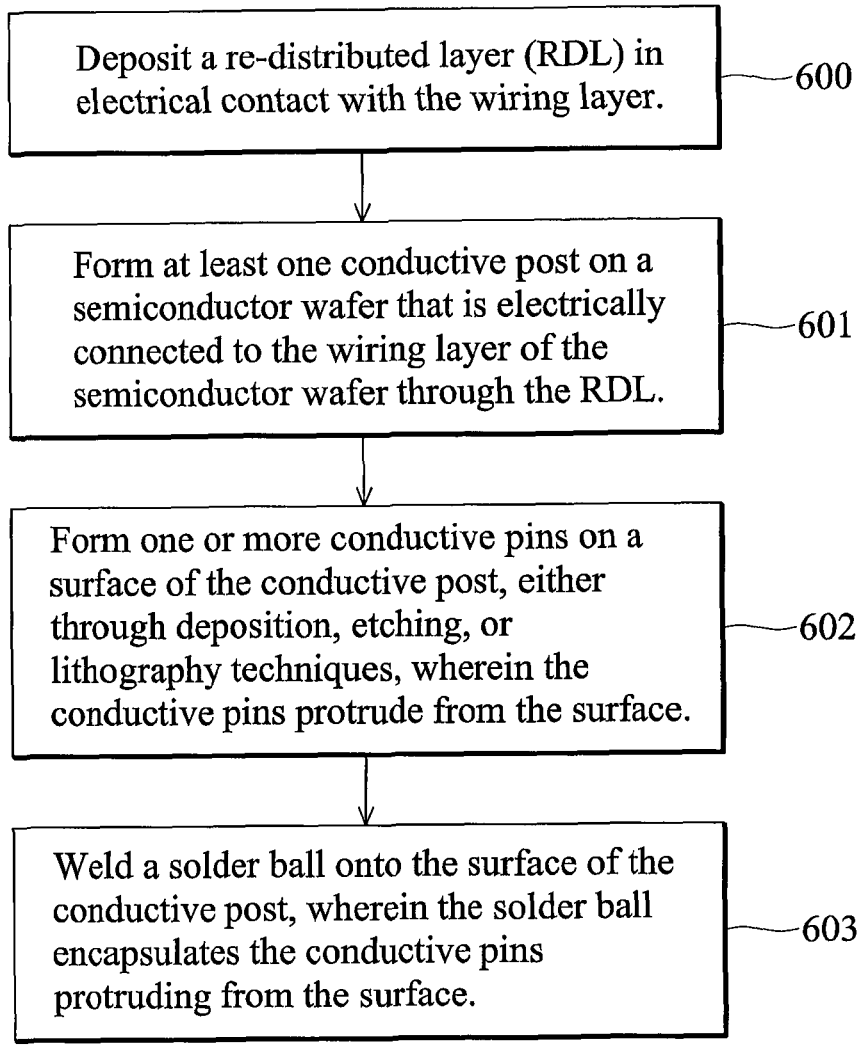
FIG. 6 is a flowchart illustrating example steps executed when implementing one embodiment of the present invention.

FIG. 6 is a flowchart illustrating example steps executed when implementing one embodiment of the present invention. In step 600, a re-distributed layer (RDL) is deposited in electrical contact with the wiring layer. At least one conductive post is formed, in step 601, on a semiconductor wafer that is electrically connected to the wiring layer of the semiconductor wafer through the RDL. One or more conductive pins are formed on a surface of the conductive post, in step 602, either through deposition, etching, or lithography techniques, wherein the conductive pins protrude from the surface. In step 603, a solder ball is welded onto the surface of each conductive post, wherein the solder ball encapsulates the conductive pins protruding from the surface.

It should be noted that the various embodiments of the present invention have been illustrated here by describing only a single solder ball and post of the whole WLCSP system. In application, an array of multiple posts, pins, and solder balls are used in order to implement the inventive system and method. The current invention is not limited to only a single solder ball, post, and pin combination.

Although the present invention and its advantages have been described in detail, it should be understood that various changes, substitutions and alterations can be made herein without departing from the spirit and scope of the invention as defined by the appended claims. For example, it will be readily understood by those skilled in the art that the materials, dimensions, and layers may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate;
    a circuit layer within said substrate;
    a wiring layer on a first surface of said substrate, said wiring layer electrically connected to said circuit layer;
    an electrode protruding from said first surface, said electrode electrically connected to said wiring layer and having one or more pins protruding from a top surface of said electrode; and
    a solder ball in contact with said top surface and encapsulating said one or more pins.

2. The semiconductor device of claim 1, further comprising:
    a polymer insulation layer located on said first surface, said electrode located within said polymer insulation layer.

3. The semiconductor device of claim 2, wherein said polymer insulation layer is made from material selected from the group consisting essentially of:
    epoxy; and
    polymide.

4. The semiconductor device of claim 2, wherein the polymer insulation layer and the electrode are coplanar.

5. The semiconductor device of claim 2, wherein the electrode protrudes from the polymer insulation layer.

6. The semiconductor device of claim 1, further comprising:
    a re-distribution layer (RDL) in electrical contact with said wiring layer and said electrode.

7. The semiconductor device of claim 6, wherein an electrical connection between said wiring layer and said electrode is provided exclusively by said RDL.

8. A semiconductor device comprising:
    a substrate;
    a wiring layer over the substrate;
    an insulation layer over the wiring layer;
    a first conductive post electrically connected to the wiring layer and extending through the insulation layer, the first conductive post comprising a single material;
    at least one pin in contact with the first conductive post;
    a solder ball surrounding the at least one pin and in physical contact with the first conductive post.

9. The semiconductor device of claim 8, wherein the at least one pin comprises at least two pins.

10. The semiconductor device of claim 8, wherein the first conductive post and the insulation layer are coplanar with each other.

11. The semiconductor device of claim 8, wherein the first conductive post extends away from the substrate further than the insulation layer.

12. The semiconductor device of claim 8, further comprising a redistribution layer electrically connecting the first conductive post to the wiring layer.

13. A semiconductor device comprising:
    a substrate;
    one or more wiring layers within a first surface of said substrate;
    a polymer insulation layer over said first surface,
    one or more conducting posts running through said polymer insulation layer between said first surface and an upper surface of said polymer insulation layer, wherein said one or more conducting posts are electrically connected to a corresponding one of said one or more wiring layers; and
    a solder ball in physical contact with a top surface of each of said one or more conducting posts and encapsulating one or more conducting pins protruding from said top surface of said one or more conducting posts.

14. The semiconductor device of claim 13, wherein the polymer insulation layer and the one or more conducting posts are coplanar.

15. The semiconductor device of claim 13, wherein the one or more conducting posts protrude from the polymer insulation layer.

16. The semiconductor device of claim 13, further comprising:
    one or more re-distribution layers (RDLs) layered on a portion of said first surface of said substrate beneath said polymer insulation layer, wherein each of said one or more RDLs is connected to said corresponding one of said one or more wiring layers.

17. The semiconductor device of claim 16, wherein said one or more RDLs provide said electrical connection between said one or more conducting posts and said corresponding one of said one or more wiring layers.

18. The semiconductor device of claim 13, wherein said polymer insulation layer is made from a material selected from the group consisting essentially of
    epoxy; and
    polymide.

19. The semiconductor device of claim 18, wherein said selection of said material is based at least in part on a coefficient of thermal expansion of said material.

20. The semiconductor device of claim 13, wherein the one or more conducting pins comprises at least two conducting pins.

* * * * *